(12) United States Patent
Huang et al.

(10) Patent No.: US 10,192,834 B2
(45) Date of Patent: Jan. 29, 2019

(54) SEMICONDUCTOR PACKAGE AND FABRICATION METHOD THEREOF

(71) Applicant: Siliconware Precision Industries Co., Ltd., Taichung (TW)

(72) Inventors: Fu-Tang Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/669,273

(22) Filed: Aug. 4, 2017

(65) Prior Publication Data
US 2017/0338186 A1    Nov. 23, 2017

Related U.S. Application Data

(62) Division of application No. 13/855,221, filed on Apr. 2, 2013, now abandoned.

(30) Foreign Application Priority Data

Jan. 8, 2013  (TW) .............................. 102100528 A

(51) Int. Cl.
*H01L 23/552* (2006.01)
*H01L 23/31* (2006.01)
(Continued)

(52) U.S. Cl.
CPC ............ *H01L 23/552* (2013.01); *H01L 21/56* (2013.01); *H01L 23/3121* (2013.01);
(Continued)

(58) Field of Classification Search
CPC ... H01L 23/552; H01L 21/56; H01L 23/3121; H01L 24/29; H01L 24/49; H01L 24/73; H01L 24/83; H01L 24/85; H01L 24/91; H01L 25/0652; H01L 25/50; H01L 25/0657; H01L 2924/00; H01L 2924/00014; H01L 2224/48227
(Continued)

(56) References Cited

U.S. PATENT DOCUMENTS

| 5,864,177 A | 1/1999 | Sundstrom |
| 6,100,594 A | 8/2000 | Fukui et al. |

(Continued)

*Primary Examiner* — Mohsen Ahmadi
*Assistant Examiner* — Patricia Reddington
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including: a substrate; a first semiconductor element disposed on the substrate and having a first conductive pad grounded to the substrate; a conductive layer formed on the first semiconductor element and electrically connected to the substrate; a second semiconductor element disposed on the first semiconductor element through the conductive layer; and an encapsulant formed on the substrate and encapsulating the first and second semiconductor elements. Therefore, the first and second semiconductor elements are protected from electromagnetic interference (EMI) shielding with the conductive layer being connected to the grounding pad of the substrate. A fabrication method of the semiconductor package is also provided.

16 Claims, 6 Drawing Sheets

(51) Int. Cl.
  *H01L 25/065* (2006.01)
  *H01L 21/56* (2006.01)
  *H01L 25/00* (2006.01)
  *H01L 23/00* (2006.01)

(52) U.S. Cl.
  CPC .............. *H01L 24/29* (2013.01); *H01L 24/49* (2013.01); *H01L 24/73* (2013.01); *H01L 24/83* (2013.01); *H01L 24/85* (2013.01); *H01L 24/91* (2013.01); *H01L 25/0652* (2013.01); *H01L 25/0657* (2013.01); *H01L 25/50* (2013.01); *H01L 24/05* (2013.01); *H01L 24/06* (2013.01); *H01L 24/32* (2013.01); *H01L 24/48* (2013.01); *H01L 24/92* (2013.01); *H01L 2224/02379* (2013.01); *H01L 2224/02381* (2013.01); *H01L 2224/04026* (2013.01); *H01L 2224/04042* (2013.01); *H01L 2224/05548* (2013.01); *H01L 2224/05554* (2013.01); *H01L 2224/05567* (2013.01); *H01L 2224/06133* (2013.01); *H01L 2224/06135* (2013.01); *H01L 2224/293* (2013.01); *H01L 2224/2929* (2013.01); *H01L 2224/32145* (2013.01); *H01L 2224/32225* (2013.01); *H01L 2224/48132* (2013.01); *H01L 2224/48137* (2013.01); *H01L 2224/48227* (2013.01); *H01L 2224/48235* (2013.01); *H01L 2224/49052* (2013.01); *H01L 2224/49107* (2013.01); *H01L 2224/49175* (2013.01); *H01L 2224/73215* (2013.01); *H01L 2224/73257* (2013.01); *H01L 2224/73265* (2013.01); *H01L 2224/92165* (2013.01); *H01L 2224/92247* (2013.01); *H01L 2225/0651* (2013.01); *H01L 2225/06537* (2013.01); *H01L 2225/06568* (2013.01); *H01L 2924/00* (2013.01); *H01L 2924/00014* (2013.01); *H01L 2924/10162* (2013.01); *H01L 2924/15311* (2013.01); *H01L 2924/181* (2013.01); *H01L 2924/19107* (2013.01); *H01L 2924/3025* (2013.01)

(58) Field of Classification Search
  USPC .......................................................... 257/659
  See application file for complete search history.

(56) References Cited

U.S. PATENT DOCUMENTS

| | | |
|---|---|---|
| 6,737,750 B1 | 5/2004 | Hoffman et al. |
| 7,531,905 B2 | 5/2009 | Ishino et al. |
| 2003/0235710 A1 | 12/2003 | Grill et al. |
| 2004/0201097 A1 | 10/2004 | Ohsumi |
| 2004/0238857 A1 | 12/2004 | Beroz et al. |
| 2004/0238934 A1 | 12/2004 | Warner et al. |
| 2007/0057357 A1* | 3/2007 | Chen .............. H01L 24/73 257/686 |
| 2007/0205495 A1* | 9/2007 | Fernandez .......... H01L 23/3128 257/686 |
| 2008/0203575 A1 | 8/2008 | Thomas et al. |
| 2009/0284947 A1 | 11/2009 | Beddingfield et al. |
| 2013/0320513 A1* | 12/2013 | Lin .............. H01L 23/552 257/659 |

* cited by examiner

SEMICONDUCTOR PACKAGE AND FABRICATION METHOD THEREOF

CROSS-REFERENCE TO RELATED APPLICATION(S)

This application is a divisional of copending application U.S. Ser. No. 13/855,221, filed on Apr. 2, 2013, which claims under 35 U.S.C. § 119(a) the benefit of Taiwanese Application No. 102100528, filed Jan. 8, 2013, the entire contents of which are incorporated herein by reference.

BACKGROUND OF THE INVENTION

1. Field of the Invention

This invention relates to semiconductor packages, and, more particularly, to a semiconductor package having an EMI shielding function and a fabrication method thereof.

2. Description of Related Art

With the development of electronic industry, electronic products at the market have demands for light weight, compact, high performance and multi functions. A semiconductor package inside a product thereby is developed toward to high computation speed, high element density and high complexity, and is further integrated with electronic components having other biological, optical, mechanical, electrical, magnetic and the like functions into the same die.

In order to correspond the trend of compact semiconductor package, system in package (SiP) develops a package structure of stacked die. However, the structure increases the element density, and results the electromagnetic interference (EMI) between a top die and a bottom die.

In order to solve the EMI problem between the top and bottom dies, the prior art forms a metal layer on the bottom face of the top die by a sputtering method. Therefore the metal layer is between the top die and the bottom die, and the EMI shielding effect can be achieved after grounding the metal layer.

Please refer to FIG. 1, which is a schematic cross sectional view of a semiconductor package 1 according to the prior art. As shown in FIG. 1, the semiconductor package 1 comprises: a substrate 10 having a grounding pad 100; a first semiconductor element 11 disposed and electrically connected through a conductive bump to the substrate 10; a second semiconductor element 13 with a sputtered metal layer 12, wherein the second semiconductor element 13 is disposed on the first semiconductor element 11 by the side of the metal layer 12, and the metal layer 12 is connected to the grounding pad 100 on the substrate 10; and an encapsulant 14 formed on the substrate 10 such that the first semiconductor element 11 and the second semiconductor element 13 are encapsulated in the encapsulant 14.

However, the metal layer 12 is formed by a sputtering method to achieve the EMI shielding effect, which is complicated and costly.

Therefore, how to overcome the EMI problem of the prior art is substantially an issue desirably to be solved in the industry.

SUMMARY OF THE INVENTION

In view of the problems of the above-mentioned prior art, the present invention provides a semiconductor package, comprising: a substrate; a first semiconductor element disposed on the substrate and having a first conductive pad grounded to the substrate; a conductive layer formed on the first semiconductor element and electrically connected to the first conductive pad; a second semiconductor element disposed on the conductive layer; and an encapsulant formed on the substrate and encapsulating the first and second semiconductor elements.

The present invention further provides a fabrication method of the semiconductor package, comprising: providing a substrate; disposing on the substrate a first semiconductor element having a first conductive pad; grounding the first conductive pad and the substrate; forming on the first semiconductor element a conductive layer electrically connected to the first conductive pad; disposing a second semiconductor element on the conductive layer; and forming on the substrate an encapsulant encapsulating the first and second semiconductor elements.

In an embodiment, the first conductive pad is grounded to the substrate by bonding wires.

In an embodiment, the first semiconductor element has a redistribution layer formed on the first conductive pad, the conductive layer is disposed on the redistribution layer, and the redistribution layer electrically connects the first conductive pad to the conductive layer and is grounded to the substrate. In an embodiment, the redistribution layer has a conductive land electrically connected to the first conductive pad, and the conductive land is grounded to the substrate by bonding wires.

In an embodiment, the first semiconductor element has a redistribution layer, and the redistribution layer has the first conductive pad.

The present invention further provides a semiconductor package, comprising: a substrate; a first semiconductor element disposed on the substrate and having a first conductive pad and a second conductive pad connected to the first conductive pad and grounded to the substrate; a conductive layer formed on the first semiconductor element and electrically connected to the first conductive pad; a second semiconductor element disposed on the conductive layer; and an encapsulant formed on the substrate and encapsulating the first and second semiconductor elements.

The present invention further provides a fabrication method of the semiconductor package, comprising: providing a substrate; disposing on the substrate a first semiconductor element having a first conductive pad and a second conductive pad connected to the first conductive pad; grounding the second conductive pad and the substrate; forming on the first semiconductor element a conductive layer electrically connected to the first conductive pad; disposing a second semiconductor element on the conductive layer; and forming on the substrate an encapsulant encapsulating the first and second semiconductor elements.

In an embodiment, the first conductive pad is electrically connected to the second conductive pad by bonding wires.

In an embodiment, the first semiconductor element has an internal circuit, and the first conductive pad is electrically connected to the second conductive pad by the internal circuit.

In an embodiment, the substrate has a grounding pad for being grounded.

In an embodiment, the second semiconductor element is electrically connected to the substrate.

In an embodiment, the conductive layer is made of a conductive adhesive.

In an embodiment, an electrical element is further disposed on the substrate and grounded to the substrate and the first semiconductor element.

From the above, in the semiconductor package and fabrication methods thereof according to the present invention, the EMI shielding effect is achieved by disposing a conductive layer between a first semiconductor element and a second semiconductor to prevent EMI between semiconductor elements.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "first", "second" and "one" in this specification are only for the convenience to describe, not for limiting the scope of embodiment in this invention. Those changes or adjustments of relative relationship without substantial change of technical content should also be considered within the category of implementation.

Figure 1:
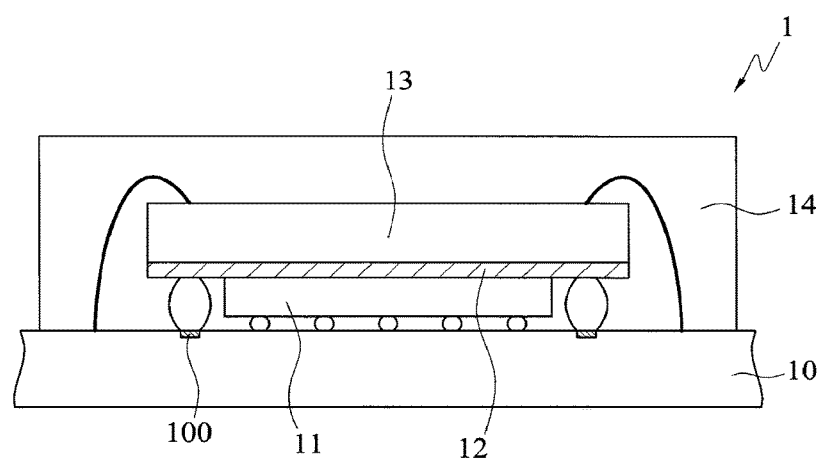
FIG. 1 is a schematic sectional view illustrating a structure of a prior semiconductor package according to the prior art.
Figure 2A:
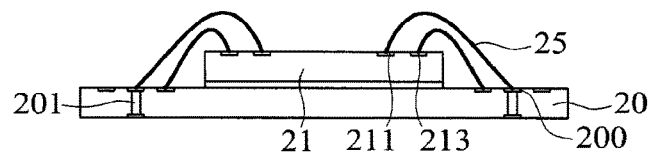
FIGS. 2A-2D are schematic sectional views of a fabrication method of a semiconductor package of a first embodiment according to the present invention, wherein FIG. 2A' is a top view of FIG. 2A, FIG. 2B' is a top view of FIG. 2B, and FIG. 2C' is a top view of FIG. 2C.
Figure 2A:
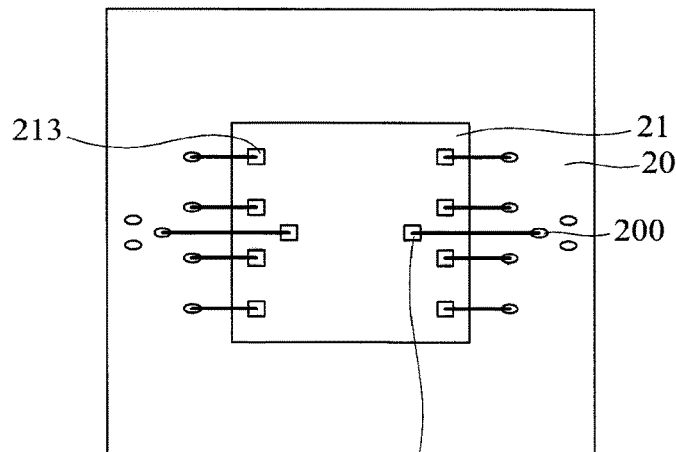
Figure 2B:
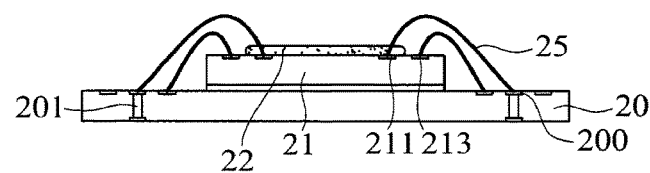
Figure 2B:
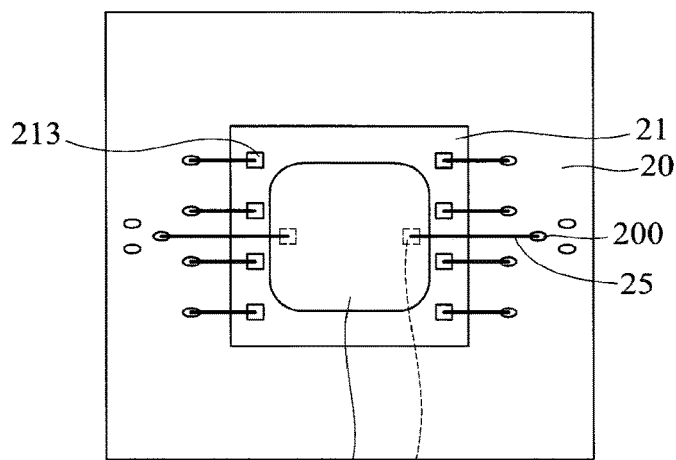
Figure 2C:
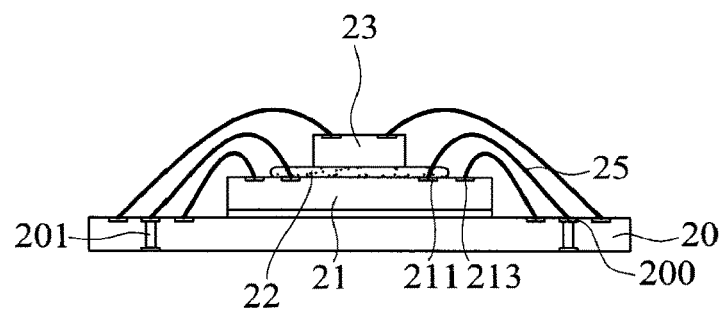
Figure 2C:
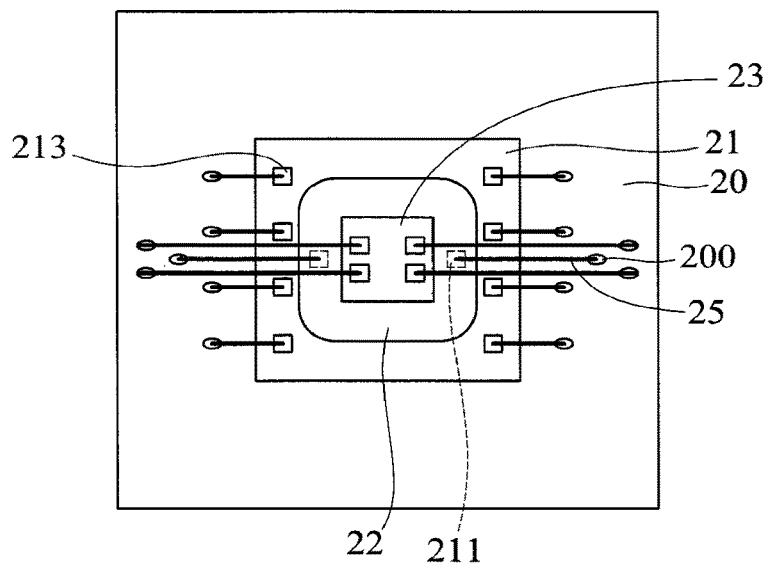

FIGS. 2A-2D are schematic sectional views illustrating a fabrication method of a semiconductor package of a first embodiment according to the present invention, wherein FIG. 2A' is a top view of FIG. 2A, FIG. 2B' is a top view of FIG. 2B, and FIG. 2C' is a top view of FIG. 2C.

As shown in FIGS. 2A and 2A', a substrate 20 having a plurality of grounding pads 200 and grounding vias 201 is provided, a first semiconductor element 21 is disposed on the substrate 20, the first semiconductor element 21 has a plurality of first conductive pads 211 for being grounded the substrate 20.

In an embodiment, the first conductive pad 211 is electrically connected to the grounding pad 200 by bonding wires 25, and the first semiconductor element 21 is a die or a packaged element.

As shown in FIG. 2B, a conductive layer 22 is formed on the first semiconductor element 21, and the conductive layer 22 covers the first conductive pads 211, and coats one end of each of the bonding wires 25 connected to the first conductive pads to electrically connects each of the first conductive pads 211.

In an embodiment, the first semiconductor element 21 also has other connecting pads 213, and the conductive layer 22 does not cover the connecting pads 213, as shown in FIG. 2B'.

Moreover, the conductive layer 22 is made of a conductive adhesive containing a metal material that can shield and block EMI to achieve the EMI shielding effect.

As shown in FIG. 2C, a second semiconductor element 23 is disposed on the conductive layer 22, and stacked on the first semiconductor element 21. The second semiconductor element 23 is electrically connected to the substrate 20 by bonding wires 25.

In an embodiment, the second semiconductor element 23 is a die or a packaged element.

Figure 2D:
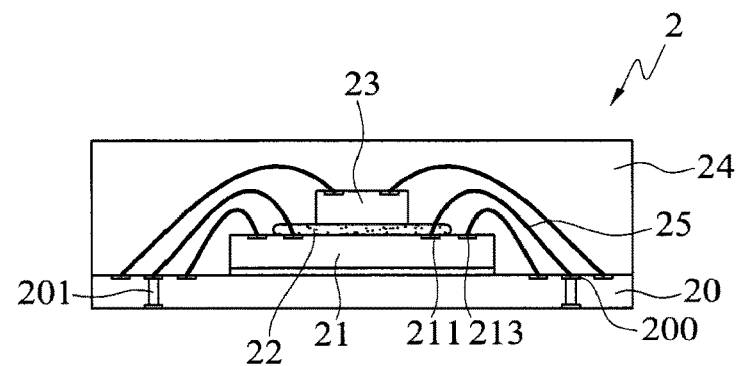

As shown in FIG. 2D, an encapsulant 24 is formed on the substrate 20 to encapsulate the first semiconductor element 21 and the second semiconductor element 23 to fabricate a semiconductor package 2 according to the present invention.

In an embodiment, forming methods and materials of the encapsulant 24 is adaptable for persons skilled in the art, and thus will not described herein.

Figure 3:
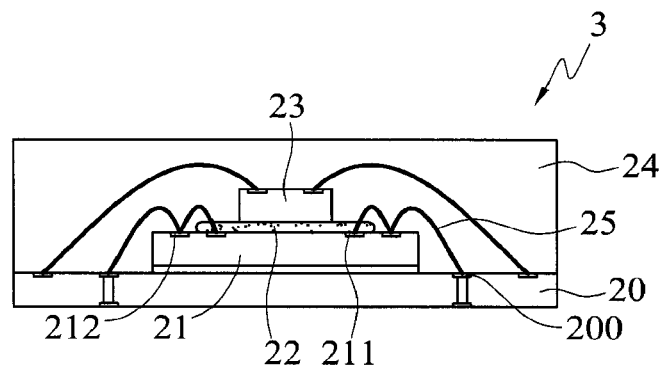
FIGS. 3 and 3' are a schematic sectional view and a top view of a semiconductor package of a second embodiment according to the present invention, wherein FIG. 3' is the top view of FIG. 3.
Figure 3:
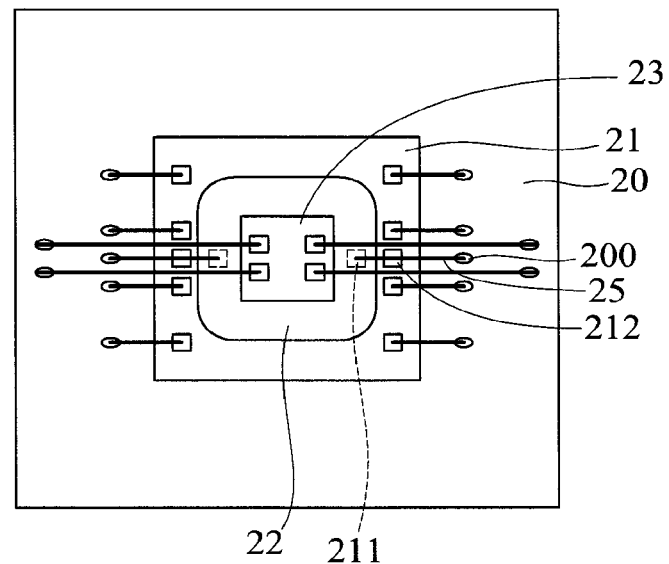

In a second embodiment shown in FIGS. 3 and 3', the first semiconductor element 21 further has a second conductive pad 212 electrically connected to the first conductive pad 211, and the second conductive pad 212 is electrically connected to the substrate 20 by bonding wires 25, wherein the first conductive pad 211 is electrically connected to the second conductive pad 212 by bonding wires 25.

Figure 4:
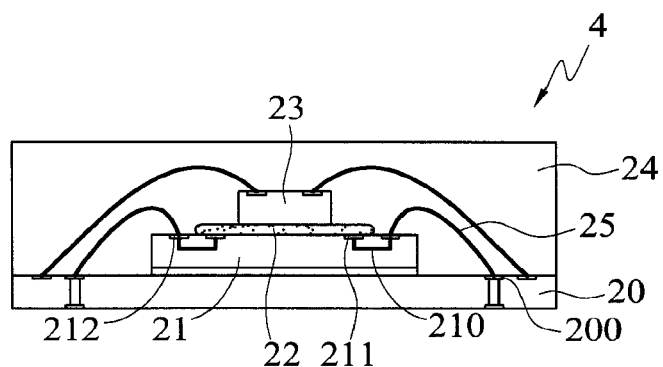
FIGS. 4 and 4' are a schematic sectional view and a top view of a semiconductor package of a third embodiment according to the present invention, wherein FIG. 4' is the top view of FIG. 4.
Figure 4:
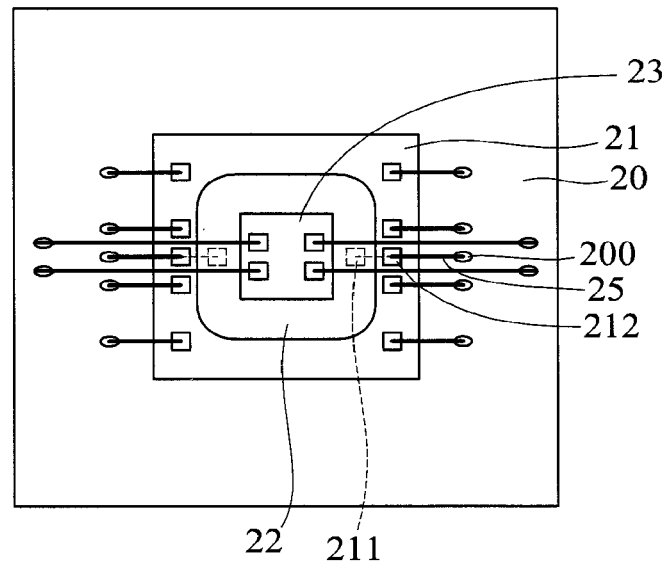

In a third embodiment shown in FIGS. 4 and 4', the first semiconductor element 21 further has an internal circuit 210 to electrically connect the first conductive pad 211 to the second conductive pad 212.

Figure 5:
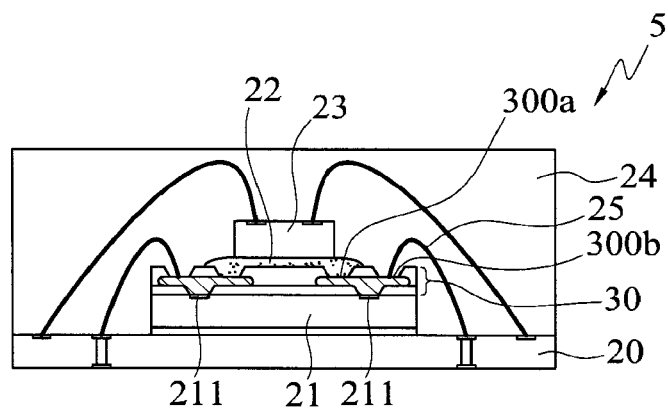
FIG. 5 is a schematic sectional view of a semiconductor package of a fourth embodiment according to the present invention.

In a fourth embodiment shown in FIG. 5, the first semiconductor element 21 has a redistribution layer 30 on the first conductive pad 211, the conductive layer 22 is disposed and electrically connected to the redistribution layer 30, and the redistribution layer 30 has conductive lands 300a, 300b electrically connected to the first conductive pad 211. A portion of the electrical contact 300b is grounded to the substrate by bonding wires 25.

Figure 6:
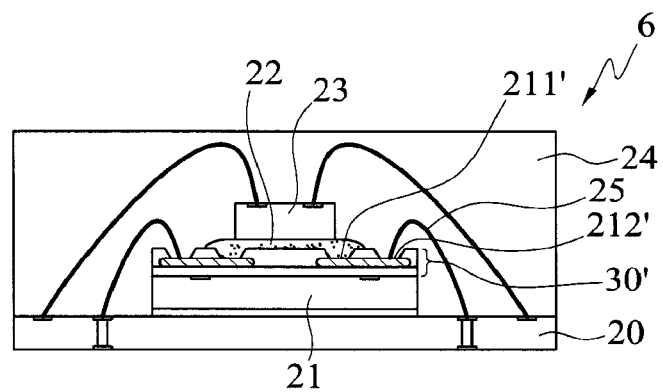
FIG. 6 is a schematic sectional view of a semiconductor package of a fifth embodiment according to the present invention.

In a fifth embodiment shown in FIG. 6, the interconnected first conductive pad 211' and second conductive pad 212' may be formed in the redistribution layer 30'.

The present invention utilizes the design of conductive layer 22 to effectively conduct remaining electricity out to the substrate 20 for grounding such that to overcome the EMI problem between the first semiconductor element 21 and the second semiconductor element 23. The semiconductor package 2, 3, 4, 5, 6 according to the present invention thereby have better EMI shielding effect.

Figure 7:
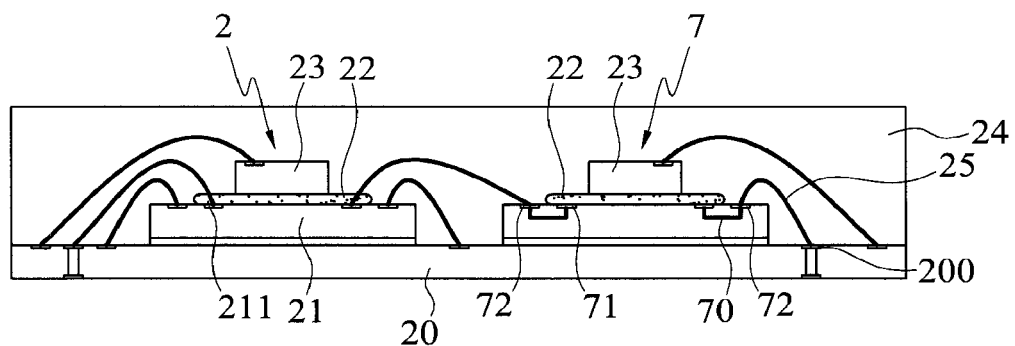
FIG. 7 is a schematic sectional view of a semiconductor package of a sixth embodiment according to the present invention.

As shown in FIG. 7, an electronic element 7 is additionally disposed on the substrate 20 of the semiconductor package 2, and is grounded to the substrate 20 and the first conductive pad 211.

In an embodiment, the electronic element 7 is considered as a stacked die structure of a semiconductor package 4 shown in FIG. 4. The second conductive pad 72 of the electronic element 7 is for being grounded the substrate 20 and electrically connected to the first conductive pad 211 of the semiconductor package 2, and the first conductive pad 71 of the electronic element 7 is electrically connected to the second conductive pad 72 of the electronic element 7 by an internal circuit 70.

The present invention provides a semiconductor package 2, 3, 4, 5, 6, comprising: a substrate 20, a first semiconductor element 21 disposed on the substrate 20, a conductive layer 22 formed on the first semiconductor element 21, a second semiconductor element 23 disposed on the conductive layer 22, and an encapsulant 24 formed on the substrate 20.

The substrate 20 has a plurality of grounding pads 200.

The first semiconductor element 21 has a plurality of first conductive pads 211 grounded to the grounding pads 200 by bonding wires 25.

In an embodiment, the first semiconductor element 21 further has a second conductive pad 212 electrically connected to the first conductive pad 211 by bonding wires 25 or an internal circuit, and the second conductive pad 212 is electrically connected to the substrate 20 by bonding wires 25.

The conductive layer 22 is electrically connected to the first conductive pad 211.

In an embodiment, the conductive layer 22 is made of a conductive adhesive.

The second semiconductor element 22 is electrically connected to the substrate 20.

The encapsulant 24 encapsulates the first and second semiconductor elements 21, 22.

In an embodiment, the first semiconductor element 21 has a redistribution layer 30 on the first conductive pad 211, and the conductive 22 is disposed on the redistribution layer 30 to electrically connect the first conductive pad 211 to the conductive layer and ground to the substrate 20. In an embodiment, the redistribution layer 30 further has conductive lands 300a, 300b electrically connected to the first conductive pad 211, and the conductive land 300b is grounded to the substrate 20 by bonding wires 25.

In an embodiment, a redistribution layer 30' has the conductive pad 211'.

In summary, the semiconductor package and fabrication methods thereof according to the present invention overcome the drawback of generating EMI while using a stacked die structure in the prior semiconductor package by a design of conductive layer. Advantages such as simple process, low cost and various applications are provided.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A semiconductor package, comprising:
a substrate;
a first semiconductor element disposed on the substrate and having a first conductive pad and a second conductive pad, wherein the second conductive pad is electrically connected to the first conductive pad by a first bonding wire and grounded to the substrate;
a conductive layer formed on the first semiconductor element and electrically connected to the first conductive pad, wherein the first semiconductor element is disposed between the conductive layer and the substrate, and the conductive layer is in direct contact with the first conductive pad and encapsulates the first conductive pad and a portion of the first bonding wire;
a second semiconductor element disposed on the conductive layer; and
an encapsulant formed on the substrate and encapsulating the first and second semiconductor elements.

2. The semiconductor package of claim 1, wherein the substrate has a grounding pad for being grounded.

3. The semiconductor package of claim 1, wherein the second conductive pad is grounded to the substrate by a second bonding wire.

4. The semiconductor package of claim 1, wherein the first semiconductor element has an internal circuit, and the first conductive pad is electrically connected to the second conductive pad through the internal circuit.

5. The semiconductor package of claim 1, wherein the second semiconductor element is electrically connected to the substrate.

6. The semiconductor package of claim 1, wherein the first semiconductor element has a redistribution layer, and the redistribution layer has the first and second conductive pads.

7. The semiconductor package of claim 1, wherein the conductive layer is made of a conductive adhesive.

8. The semiconductor package of claim 1 further comprising an electronic element disposed on the substrate and grounded to the substrate and the first semiconductor element.

9. A fabrication method of a semiconductor package, comprising:
providing a substrate;
disposing on the substrate a first semiconductor element having a first conductive pad and a second conductive pad electrically connected to the first conductive pad by a first bonding wire;
grounding the second conductive pad and the substrate;
forming on the first semiconductor element a conductive layer electrically connected to the first conductive pad, wherein the first semiconductor element is disposed between the conductive layer and the substrate, and the conductive layer is in direct contact with the first conductive pad and encapsulates the first conductive pad and a portion of the first bonding wire;
disposing a second semiconductor element on the conductive layer; and
forming on the substrate an encapsulant encapsulating the first and second semiconductor elements.

10. The fabrication method of claim 9, wherein the substrate has a grounding pad for being grounded.

11. The fabrication method of claim 9, wherein the second conductive pad is grounded to the substrate by a second bonding wire.

12. The fabrication method of claim 9, wherein the first semiconductor element has an internal circuit, and the first conductive pad is electrically connected to the second conductive pad through the internal circuit.

13. The fabrication method of claim 9, wherein the second semiconductor element is electrically connected to the substrate.

14. The fabrication method of claim 9, wherein the first semiconductor element has a redistribution layer, and the redistribution layer has the first and second conductive pads.

15. The fabrication method of claim 9, wherein the conductive layer is made of a conductive adhesive.

16. The fabrication method of claim 9 further comprising disposing on the substrate an electronic element grounded to the substrate and the first semiconductor element.

* * * * *